(12) United States Patent  
Kitano et al.

(10) Patent No.: US 8,441,807 B2
(45) Date of Patent: May 14, 2013

(54) ELECTRONIC CIRCUIT (75) Inventors: Naofumi Kitano, Osaka (JP); Toshiro Nishimura, Osaka (JP)

(73) Assignee: Panasonic Corporation, Osaka (JP)

( * ) Notice: Subject to any disclaimer, the term of this patent is extended or adjusted under 35 U.S.C. 154(b) by 154 days.

(21) Appl. No.: 13/040,915

(22) Filed: Mar. 4, 2011

(65) Prior Publication Data

US 2011/0222255 A1 Sep. 15, 2011

(30) Foreign Application Priority Data

Mar. 10, 2010 (JP) ................................. 2010-053317
Oct. 14, 2010 (JP) ................................. 2010-231660

(51) Int. Cl.
*H05K 7/00* (2006.01)

(52) U.S. Cl.
USPC ............ 361/782; 361/760; 361/763; 174/260

(58) Field of Classification Search .................. 361/782, 361/760, 763; 174/260
See application file for complete search history.

(56) References Cited

U.S. PATENT DOCUMENTS 7,593,208 B2 * 9/2009 Anthony et al. ............. 361/118
2006/0170630 A1 * 8/2006 Hur et al. ..................... 345/77

FOREIGN PATENT DOCUMENTS

EP 1 143 507 10/2001
JP 2000-183286 6/2000
JP 2007-048879 2/2007

* cited by examiner

*Primary Examiner* — Timothy Thompson
*Assistant Examiner* — Andargie M Aychillhum
(74) *Attorney, Agent, or Firm* — Hamre, Schumann, Mueller & Larson, P.C.

(57) ABSTRACT

An electronic circuit is obtained that has reduced EMI levels. The circuit includes an integrated circuit, which is a source of noise, a bypass capacitor, and a circuit substrate on which they are mounted. An electronic circuit one electrode terminal of the bypass capacitor and one connecting electrode of the integrated circuit are connected through a first wire interconnect formed in the circuit substrate, and, additionally, another electrode terminal of the bypass capacitor and another connecting electrode of the integrated circuit are connected through a second wire interconnect, and the gap between the first wire interconnect and the second wire interconnect is made smaller than either the gap between the one connecting electrode and the other connecting electrode on the integrated circuit or the gap between the one electrode terminal and the other electrode terminal of the bypass capacitor.

5 Claims, 10 Drawing Sheets

ELECTRONIC CIRCUIT

BACKGROUND OF THE INVENTION

1. Field of the Invention

This invention relates to an electronic circuit that suppresses electromagnetic noise emissions from integrated circuits, and, in particular, relates to an electronic circuit that is capable of meeting stricter standards for the suppression of electromagnetic noise emissions.

2. Description of Related Art

A variety of integrated circuits (ICs, LSI chips, etc.) imparted with microcomputer and logic circuit functionalities have been used as the basic components of various electronic and information devices. During the operation of such integrated circuits as active devices, their power consumption does not remain constant and varies from moment to moment, thereby causing the power supply voltage of the power supply lines supplying drive voltage to the integrated circuits to fluctuate from instant to instant in response to variations in load. This voltage fluctuation leads to electromagnetic noise emissions (EMI) from the integrated circuit.

One method used to keep the emission of electromagnetic noise into the environment by such an integrated circuit during its operation in compliance with regulatory values involves in interposing a bypass capacitor between the power supply line of the integrated circuit and the ground. However, when electromagnetic noise emitted from a circuit operating at high frequencies, i.e. an integrated circuit, is suppressed by using a bypass capacitor, the impedance of the traces connected to the integrated circuit cannot be ignored and, therefore, the bypass capacitor has to be placed at a location in close physical proximity to the integrated circuit operating as an active device.

Figure 9:
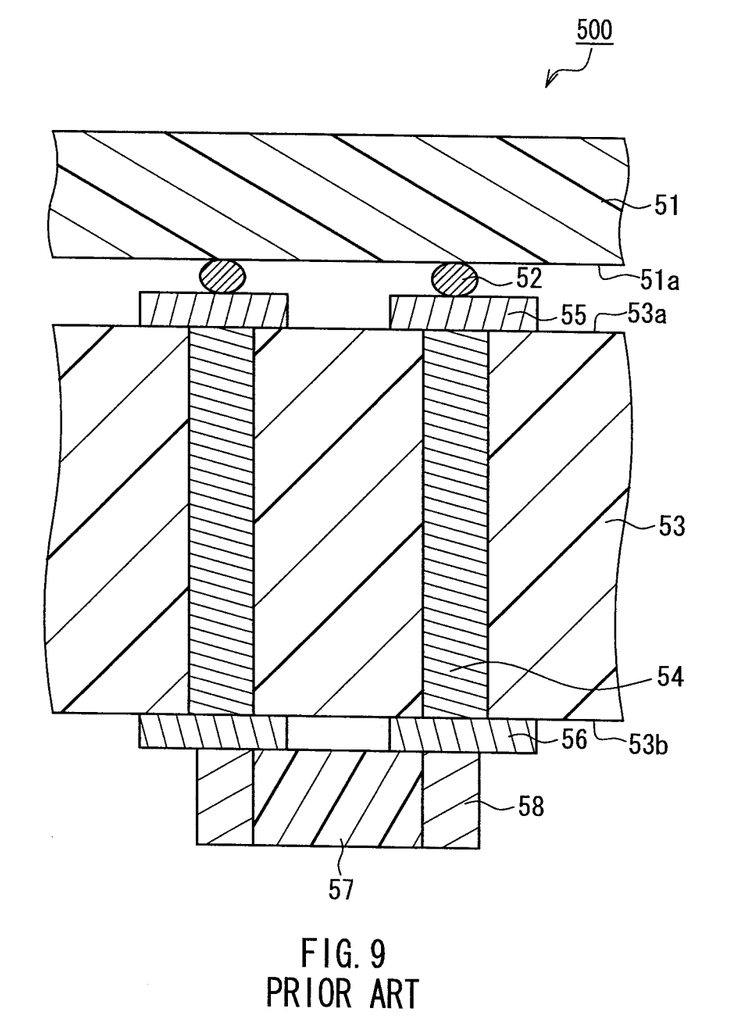
FIG. 9 is an enlarged cross-sectional view of the main body illustrating the cross-sectional configuration of the bypass capacitor-bearing portion of a conventional EMI-shielded electronic circuit.
Figure 10:
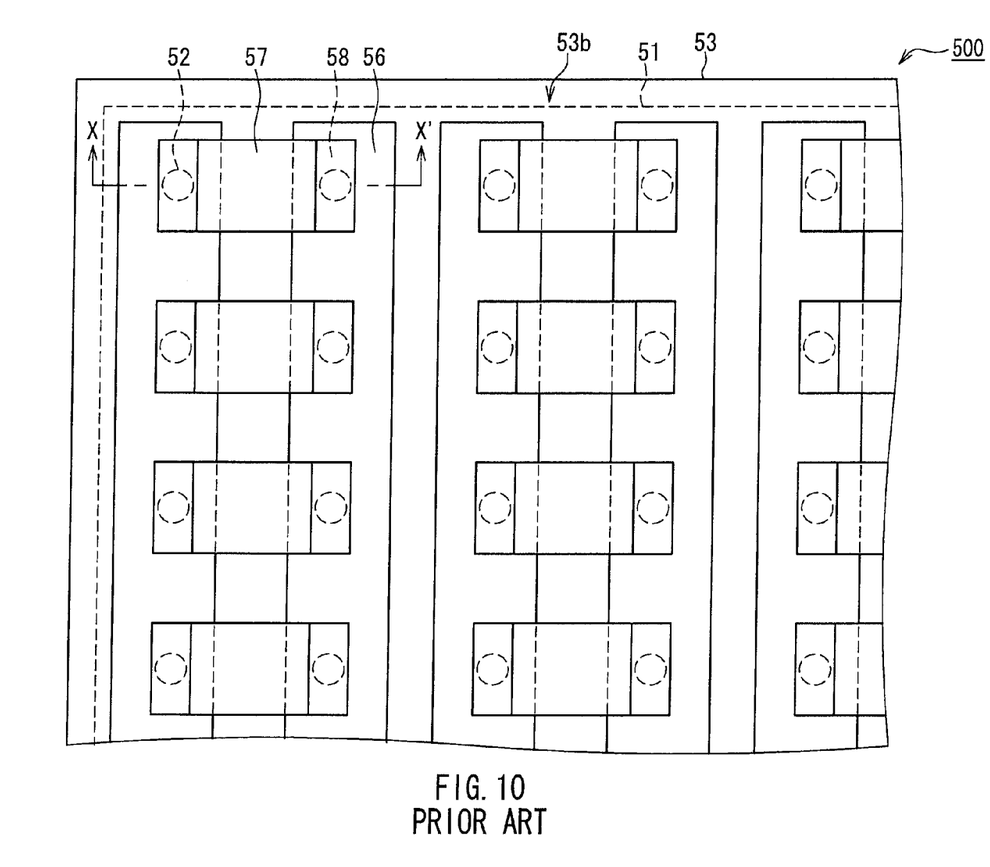
FIG. 10 is an enlarged plan view of the main body illustrating the configuration of the back surface of a conventional EMI-shielded electronic circuit.

FIG. 9 and FIG. 10 illustrate the configuration of a conventional electronic circuit fitted with a bypass capacitor as a means for suppressing electromagnetic noise emissions. FIG. 9 is an enlarged cross-sectional view of the main body of the conventional electronic circuit, and FIG. 10 is an enlarged plan view of the main body. It should be noted that FIG. 9 shows a cross-sectional configuration of the portion shown by the arrow line x-x' in FIG. 10.

As shown in FIG. 9, the conventional electronic circuit 500 includes an LSI chip used as an integrated circuit 51, a circuit substrate 53, and a bypass capacitor 57.

The integrated circuit 51 is flip-chip mounted to the circuit substrate 53 through multiple bump electrodes 52 formed on one of its major surfaces, 51a. Multiple electrode pads 55 are formed on the mounting surface 53a of the circuit substrate 53 at locations corresponding to the locations of placement of the bump electrodes 52 of the integrated circuit 51. In addition, device-mounting electrodes 56, which are used for mounting the bypass capacitor 57, are formed on the back surface 53b of the circuit substrate, and the electrode pads 55 are connected to the device-mounting electrodes 56 by through wire interconnects 54 formed in the circuit substrate 53. Electrode terminals 58 at both ends of the bypass capacitors 57 are connected to the second electrode pads 56, thereby mounting the bypass capacitor 57 on the back surface 53b of the circuit substrate 53.

FIG. 10 shows a planar configuration of the conventional electronic circuit 500, as viewed from the back surface 53b of the circuit substrate 53, in other words, from the side used to mount the bypass capacitor 57. It should be noted that, in order avoid overcomplicating the drawing, the first pad electrodes 55 and through wire interconnects 54 formed in the circuit substrate 53 have been omitted from the drawing.

As shown in FIG. 10, in the conventional electronic circuit 500, multiple bypass capacitors 57 are placed on, and secured to, the back surface 53b of the circuit substrate 53 such that the placement locations of the respective electrode terminals 58 correspond to the locations of formation of the bump electrodes 52, which are aligned in a regular two-dimensional matrix configuration on the major surface of the integrated circuit 51. Furthermore, in the conventional electronic circuit 500, the respective bypass capacitors 57 are placed such that electric currents flow in the same direction in all of them, and, for this reason, the device-mounting electrodes 56 formed on the back surface 53b of the circuit substrate 53 are formed in the shape of strips extending vertically in FIG. 10, with the electrode terminals 58 of the multiple bypass capacitors 57 connected to the strip-shaped device-mounting electrodes 56.

As shown in FIG. 9 and FIG. 10, in the conventional electronic circuit 500, the bump electrodes 52 of the integrated circuit 51 and the electrode terminals 58 at both ends of the bypass capacitor 57 are placed such that they are in alignment in the thickness direction of the circuit substrate 53 together with the through wire interconnects 54 that provide a connection therebetween. Thus, in the conventional electronic circuit 500, the bump electrodes 52 of the integrated circuit 51 and the electrode terminals 58 of the bypass capacitor 57 are connected across the narrowest distance via the through wire interconnects 54 of the circuit substrate 53, which makes it possible for both of them to be placed in the closest physical proximity and prevents trace impedance from reducing the inhibiting effect on the high-frequency component of the electromagnetic radiation.

Furthermore, other disclosures of technologies for suppressing the emission of electromagnetic noise from integrated circuits using bypass capacitors have described a technology in which bypass capacitors are integrated into ICs in order to bring the integrated circuits and the bypass capacitors closer together (JP 2000-183286A), and a technology that makes use of bypass capacitors with different resonance frequencies, wherein the bypass capacitors are placed such that the closer they are to the power supply terminal, the lower their resonance frequency becomes (JP 2007-48879A).

In recent years, the magnitude of the supply currents required by LSI chips, ICs, and other integrated circuits has been on the increase. In addition, the regulatory values applicable to electromagnetic noise emissions (EMI) gradually have become more stringent due to concerns about preventing adverse effects on the human body and interference with other electronic circuits. In such a situation, it has become increasingly difficult to reduce electromagnetic noise emitted from integrated circuits to within the desired numerical values using the conventional approaches, in which bypass capacitors are placed in the closest possible proximity to the source of the noise, i.e. the integrated circuits.

The object of the invention disclosed in this application, which solves such prior-art problems, is to provide an electronic circuit that includes a circuit substrate having mounted thereon an integrated circuit, i.e. a noise source, and bypass capacitors, and that is capable of satisfying stringent regulatory requirement values for electromagnetic noise emissions.

SUMMARY OF THE INVENTION

In order to solve the problems outlined above, the electronic circuit disclosed herein includes an integrated circuit, a bypass capacitor, and a circuit substrate that has mounted thereon the integrated circuit and bypass capacitor. In the circuit, one electrode terminal of the bypass capacitors and one connecting electrode on the integrated circuit are connected through a first wire interconnect formed in the circuit substrate, while the other electrode terminal of the bypass capacitor and the other connecting electrode of the integrated circuit are connected through a second wire interconnect formed in the circuit substrate. In addition, the gap between the first wire interconnect and the second wire interconnect is narrower than either the gap between the one connecting electrode and the other connecting electrode on the integrated circuit or the gap between the one electrode terminal and the other electrode terminal of the bypass capacitors.

DETAILED DESCRIPTION OF THE INVENTION

The electronic circuit disclosed herein includes an integrated circuit, a bypass capacitor, and a circuit substrate that has mounted thereon the integrated circuit and the bypass capacitor. One electrode terminal of the bypass capacitor and one connecting electrode of the integrated circuit are connected through a first wire interconnect formed in the circuit substrate, while the other electrode terminal of the bypass capacitor and the other connecting electrode of the integrated circuit are connected through a second wire interconnect formed in the circuit substrate. The gap between the first wire interconnect and the second wire interconnect is smaller than either the gap between the one connecting electrode and the other connecting electrode on the integrated circuit or the gap between the one electrode terminal and the other electrode terminal of the bypass capacitor.

As a result, the two wire interconnects, which have electric current flowing therethrough in mutually different directions, can be placed closer together to produce a magnetic field cancellation effect, whereby each of the magnetic stray fields of different polarity generated by the respective wire interconnects cancels out the other magnetic field. This makes it possible to obtain an electronic circuit that produces strong electromagnetic noise emission suppression effects even if an integrated circuit operating at high frequencies is used as the active device.

In the above-mentioned electronic circuit disclosed herein, the integrated circuit is flip-chip mounted to the mounting surface of the circuit substrate through the bump electrodes as the connecting electrodes, the bypass capacitors are mounted on the back surface of the substrate, and both the first wire interconnect and the second wire interconnect are through wire interconnects that connect the mounting surface of the circuit substrate to its back surface. This makes it possible to obtain a flip-chip mounted electronic circuit, in which electromagnetic noise emissions are suppressed efficiently.

In addition, it should be noted that the circuit substrate preferably is a multi-layer substrate formed by laminating multiple substrates, in which the first wire interconnect and the second wire interconnect are formed as unions of through wire interconnects formed in each respective substrate stratum constituting the multi-layer substrate and the gap between the through wire interconnects formed in a substrate located in a central portion in the thickness direction of the multi-layer substrate is smaller than the gap between the through wire interconnects formed in a substrate disposed on the surface of the multi-layer substrate. In this manner, an electronic circuit that has low levels of electromagnetic noise emissions while providing dense integration using a multi-layer substrate can be obtained without changing the locations or shapes of the through wire interconnects formed in the substrates disposed on the surfaces of the multi-layer substrate.

In this case, there are respectively formed multiple through wire interconnects that form the first wire interconnect and the second wire interconnect. This allows for the trace resistance of the through wire interconnects to be reduced.

In addition, the multiple through wire interconnects forming the first wire interconnect preferably are placed in a staggered manner such that they enter the gaps between the multiple through wire interconnects forming the second wire interconnect. This allows for pairs of through wire interconnects having electric current flowing in opposite directions to be placed closer together while ensuring the independence of the respective through wire interconnects.

Furthermore, the bypass capacitors mounted on the back surface of the circuit substrate form groups of two capacitors, and the two bypass capacitors forming such a group are placed at a placement pitch that is narrower than the placement pitch of the bump electrodes of the integrated circuit, to which they are connected respectively, and, at the same time, such that the electric currents flowing through the two bypass capacitors that form the group are oriented in mutually opposite directions. This makes it possible to obtain an electronic circuit that achieves even lower levels of electromagnetic noise emissions based on the magnetic field cancellation effects generated by the electric currents flowing through the bypass capacitors.

In addition, in the wiring pattern formed on the circuit substrate, the integrated circuit preferably is mounted on the circuit substrate using lead frame terminals that serve as the connecting electrodes, and the first wire interconnect and the second wire interconnect preferably are wiring patterns formed on the circuit substrate that connects the lead frame terminals to the electrode terminals of the bypass capacitor. This makes it possible to obtain an electronic circuit that is equipped with a lead frame-bonded integrated circuit and offers low levels of electromagnetic noise emissions.

Specific embodiments of the electronic circuit disclosed herein are described below with reference to the drawings.

It should be noted that, for convenience, only the main components required for describing the invention disclosed herein are shown among the constituent components of the electronic circuits in the drawings referenced hereinbelow. Therefore, the electronic circuit disclosed herein may include optional constituent components not shown in the referenced drawings. In addition, the dimensions of the components in the drawings do not always faithfully represent the size of the actual constituent components and the dimensional proportions etc. of the components.

Embodiment 1

Figure 1:
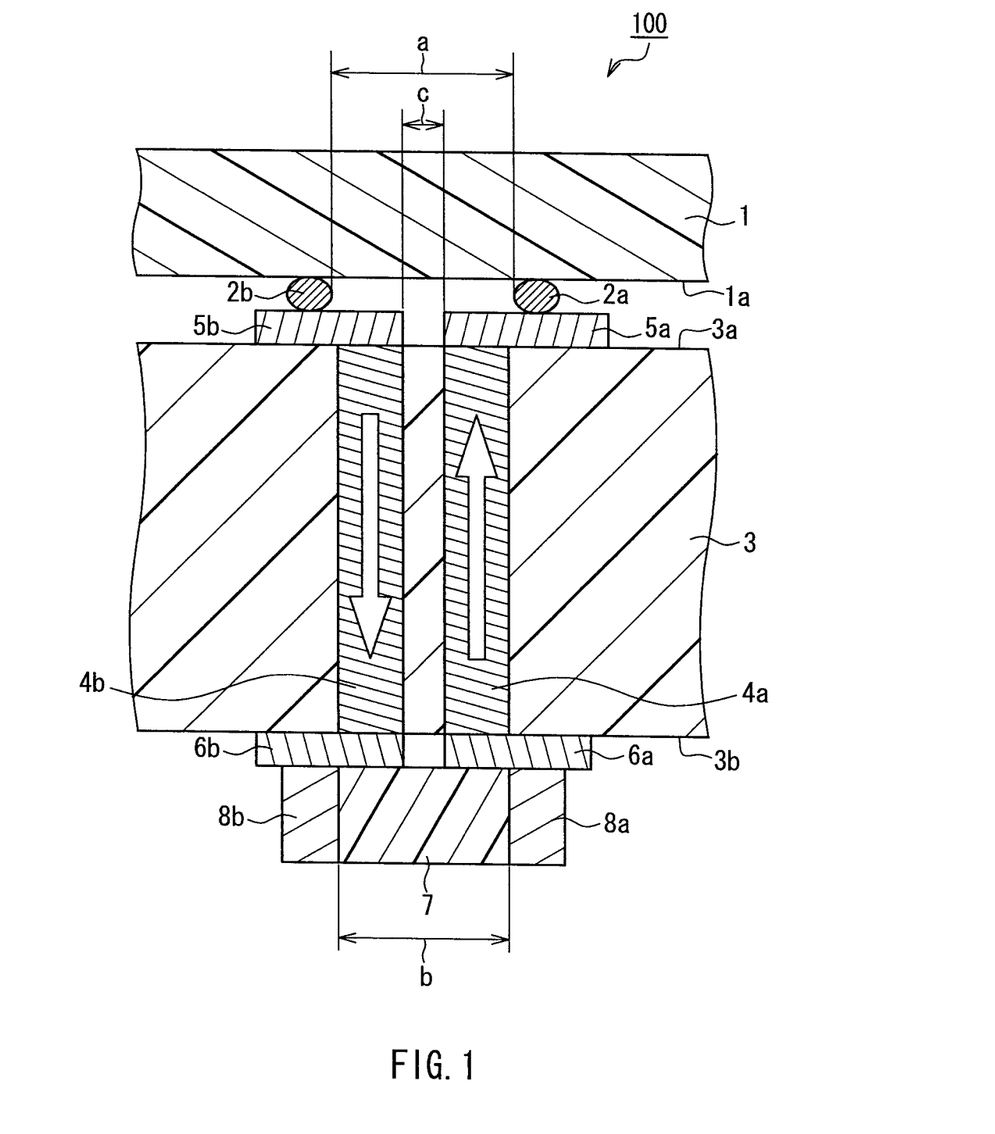
FIG. 1 is an enlarged cross-sectional view of the main body illustrating the cross-sectional configuration of the bypass capacitor-bearing portion of the electronic circuit according to the first embodiment.

FIG. 1, which provides an example of the electronic circuit used in the first embodiment, is a cross-sectional view of the main body illustrating the cross-sectional configuration of an electronic circuit, in which an integrated circuit is flip-chip mounted to a circuit substrate.

As shown in FIG. 1, the electronic circuit 100 includes an LSI chip used as an integrated circuit 1, a circuit substrate 3, and a bypass capacitor 7.

Figure 2:
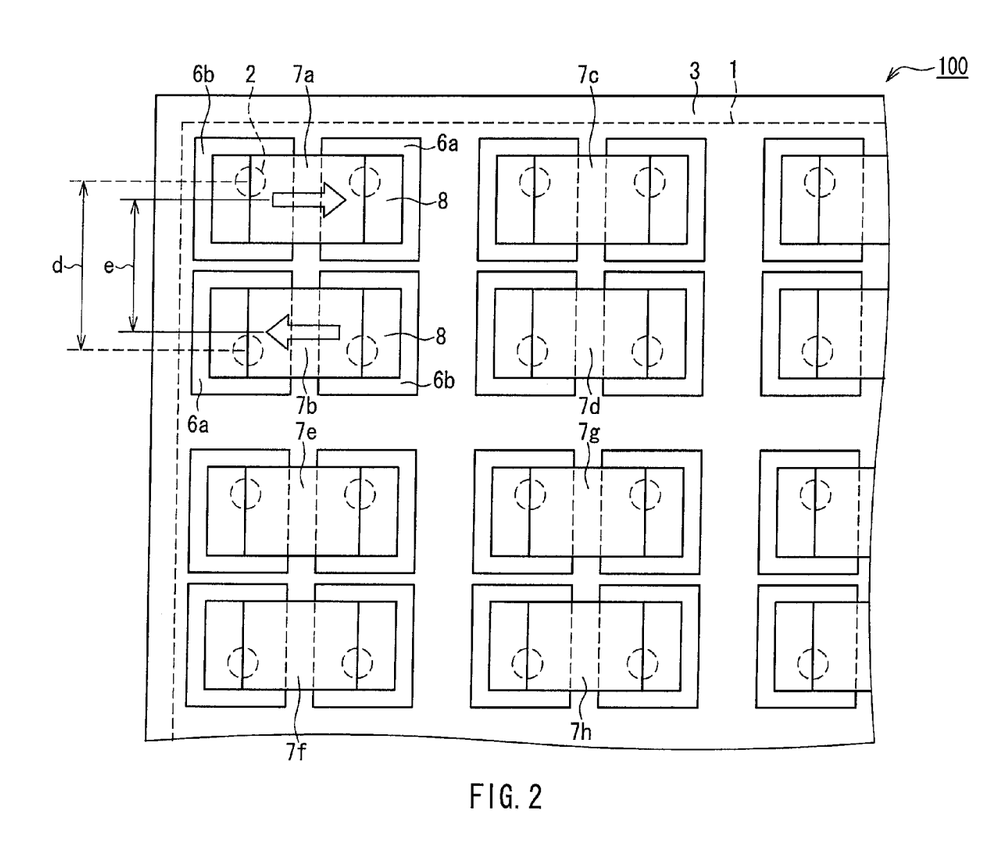
FIG. 2 is an enlarged plan view of the main body illustrating the configuration of the back surface of the circuit substrate of the electronic circuit according to the first embodiment.

The integrated circuit 1 is, for example, a flip-chip mounted LSI chip, in which multiple bump electrodes 2 (2a and 2b) used as connecting electrodes for providing a connection to the circuit substrate 3 are arranged on one of the major surfaces of the integrated circuit 1, i.e. its lower surface 1a as shown in FIG. 1. Although for convenience only two bump electrodes 2a and 2b are shown as bump electrodes 2 in FIG. 1, as shown in FIG. 2, which is described below, the bump electrodes 2 of the integrated circuit 1 of the present embodiment are aligned in a matrix configuration that is arranged transversely and longitudinally across the entire major surface of the integrated circuit 1. Furthermore, in the flip-chip mounted integrated circuit 1 of the present embodiment, which is fitted with bump electrodes 2, there are no constraints on the arrangement pattern of the bump electrodes 2. In addition, as used in the present embodiment, the term "integrated circuit" refers to an electronic component on which a large number of circuit devices are mounted within a narrow surface area using semiconductor techniques, and which typically is represented by components including, but not limited to, LSI chips and ICs.

The circuit substrate 3 is of the type suitable for the flip-chip mounting of the integrated circuit 1. Mounting electrode pads 5 (5a and 5b), which provide a connection to the integrated circuit 1, are formed at locations corresponding to the locations where the bump electrodes 2 of the integrated circuit 1 are formed on the surface, to which the integrated circuit 1 is mounted, i.e. on the mounting surface 3a located at the top of FIG. 1.

The bypass capacitor 7 is mounted on the rear surface that is opposite the mounting surface 3a of the circuit substrate 3, i.e. on the back surface 3b, which is located at the bottom of FIG. 1. For this purpose, the device-mounting electrodes 6 (6a and 6b) are formed on the back surface 3b of the circuit substrate 3 so as to match the gap between the electrode terminals 8 (8a and 8b) located at both ends of the bypass capacitor 7. In addition, the mounting electrode pads 5 formed on the mounting surface 3a of the circuit substrate 3 and the device-mounting electrodes 6 formed on the back surface 3b are connected by a first through wire interconnect 4a and a second through wire interconnect 4b provided inside via holes passing through the circuit substrate 3.

The bypass capacitor 7 may be, for example, a chip-type ceramic capacitor. The electrode terminals 8 (8a and 8b) formed at both ends thereof are soldered to the device-mounting electrodes 6 (6a and 6b) formed on the back surface 3b of the circuit substrate 3. In this manner, one of the electrode terminals 8a of the bypass capacitor 7 is connected to the bump electrode 2a, which is one of the connecting electrodes of the integrated circuit 1, through the device-mounting electrode 6a formed on the back surface of the circuit substrate 3, the first through wire interconnect 4a (which is the first wire interconnect formed in the circuit substrate 3), and the mounting electrode pad 5a formed on the component-bearing side 3a of the circuit substrate 3. In addition, the other electrode terminal 8b of the bypass capacitor 7 is connected to the bump electrode 2b, which is another connecting electrode of the integrated circuit 1, through the device-mounting electrode 6b formed on the back surface 3b of the circuit substrate 3, the second through wire interconnect 4b (which is the second wire interconnect formed in the circuit substrate 3), and the mounting electrode pad 5b formed on the component-bearing side 3a of the circuit substrate 3.

It should be noted that capacitors of other types, such as electrolytic capacitors, can be used as the bypass capacitors in addition to the ceramic capacitor illustrated above.

As shown in FIG. 1, in the electronic circuit 100 of the present embodiment, the gap "c" between the first through wire interconnect 4a, which connects one of the electrode terminals 8a of the bypass capacitor 7 to the bump electrode 2a of the integrated circuit 1, and the second through wire interconnect 4b, which connects the other electrode terminal 8b of the bypass capacitor 7 to the bump electrode 2b of the integrated circuit 1, is smaller than the gap "a" between the bump electrodes 2a and 2b on the integrated circuit 1 or the gap "b" between the electrode terminals 8a, 8b of the bypass capacitor 7. It should be noted that, as used herein, the term "gap" refers literally to the shortest distance between two components and, as a concept, differs from "placement pitch", which refers to the center-to-center distance between the two components.

Since the electric current flowing through the first through wire interconnect 4a and the electric current flowing through second through wire interconnect 4b are opposite in direction, as shown by the white arrows in FIG. 1, the magnetic stray field generated by the current flowing through the first through wire interconnect 4a and the magnetic stray field generated by the current flowing through the second through wire interconnect 4b have mutually opposite polarities and cancel each other out. In the electronic circuit of the present invention, making the gap "c" between the first through wire interconnect 4a and second through wire interconnect 4b shorter than either one of the gap "b" between the electrode terminals 8a and 8b or the gap "a" between the connecting electrodes 2a and 2b produces a magnetic stray field cancellation effect and reduces the electromagnetic noise emitted from the electronic circuit 100.

FIG. 2 is an enlarged plan view of the main body illustrating the configuration of the back surface 3b of the circuit substrate 3 of the electronic circuit 100 according to the present embodiment. It should be noted that since FIG. 2 corresponds to FIG. 10, which shows the planar configuration of the conventional electronic circuit 500, the mounting electrode pads 5 formed on the circuit substrate 3 and the through wire interconnect 4 formed on the circuit substrate 3 are omitted from FIG. 2 in order to avoid overcomplicating the drawing.

As shown in FIG. 2, in the electronic circuit 100 of the present embodiment, the bypass capacitors 7 (7a, 7b, 7c, 7d, 7e, 7f, 7g, and 7h), which are mounted on the back surface 3b of the circuit substrate 3, form groups of two adjacent capacitors and the placement pitch of the two bypass capacitors making up such groups, i.e. (7a and 7b), (7c and 7d), (7e and 7f), and (7g and 7h), in other words, the center-to-center distance "e" between the bypass capacitors 7, is narrower than the placement pitch of the bump electrodes 2 of the integrated circuit 1, in other words, the center-to-center distance "d" between the bump electrodes 2, to which the respective bypass capacitors 7 are connected.

In addition, as shown by the white arrows in FIG. 2 for 7a and 7b, in the electronic circuit 100 of the present embodiment the grouped bypass capacitors (7a and 7b), (7c and 7d), (7e and 7f), and (7g and 7h), which are mounted on the back surface 3b of the circuit substrate 3, are placed such that the directions of the respective electric currents are mutually opposite.

In this manner, placing the bypass capacitors 7 close together in groups of two and, at the same time, orienting the electric currents flowing therethrough in mutually opposite directions makes it possible to produce magnetic stray field cancellation effects based on using magnetic fields of opposite polarities generated by electric currents of mutually opposite directions flowing through the bypass capacitors 7. For this reason, in addition to the electromagnetic noise emission cancellation effect produced due to the opposite orientation of the electric currents flowing through the first through wire interconnect 4a and second through wire interconnect 4b illustrated in FIG. 1, the circuit is capable of producing even stronger suppression effects on electromagnetic noise emissions.

It should be noted that, as described above, in the electronic circuit 100 of the present embodiment illustrated in FIG. 2, the electric currents flowing through the bypass capacitors that form closely-spaced groups (7a and 7b), (7c and 7d), (7e and 7f), and (7g and 7h), are opposite in direction. On the back surface 53b of the circuit substrate 53 used in the conventional electronic circuit 500 shown in FIG. 10, the device-mounting electrodes 56 were formed in the shape of strips and the terminal electrodes 58 on one side of the multiple bypass capacitors 57 were connected in common to a single device-mounting electrode 56. However, in the present embodiment, the device-mounting electrodes 6 (6a and 6b) of the electronic circuit 100 are formed in an island-like pattern and only one electrode terminal 8 of each respective bypass capacitor 7 is connected.

As explained above with reference to FIG. 1 and FIG. 2, in the electronic circuit 100 of the present embodiment, magnetic stray field cancellation effects are produced and electromagnetic noise emissions are suppressed with the help of the electric currents flowing through the first and second through wire interconnects 4a and 4b, which connect the bypass capacitors 7 to the bump electrodes 2 of the integrated circuit 1, i.e. the noise source, as well as with the help of the electric currents flowing through the bypass capacitors 7 itself.

In order to examine the effects, electromagnetic noise emissions from the electronic circuit 100 according to the present embodiment and electromagnetic noise emissions from a conventional electronic circuit 500, such as the one shown in FIG. 9 and FIG. 10, were measured.

It should be noted that the pitch used to form the bump electrodes on the LSI chip, i.e. the integrated circuit, in the electronic circuit used for measurements was 0.6 mm both transversely and longitudinally. In addition, among the 40 bypass capacitors that were used, 24 bypass capacitors had no constraints on the shape of the wiring patterns formed on the circuit substrate and were subjected to electromagnetic noise emission suppression measures described in the present embodiment, that is, wire interconnect gap reduction, and close placement of the bypass capacitors in such a manner that the electric currents flowing through the bypass capacitors are opposite in direction, as explained in the present embodiment described above. Specifically, the gap between the through wire interconnects connected to the 24 bypass capacitors was set to 0.08 mm, i.e. to the limit value for forming adjacent vias in the circuit substrate. In addition, these 24 bypass capacitors were arranged in groups of two and the placement pitch of the bypass capacitors forming such groups on the back surface of the circuit substrate was set to 0.35 mm. Both in the conventional electronic circuit and in the 16 bypass capacitors that had been subjected to the modifications described in the present embodiment, the placement gap of the through wire interconnects and the placement pitch of the bypass capacitors on the back surface of the circuit substrate were set to 0.6 mm, i.e., it was the same as the pitch used to form the bump electrodes.

Figure 3:
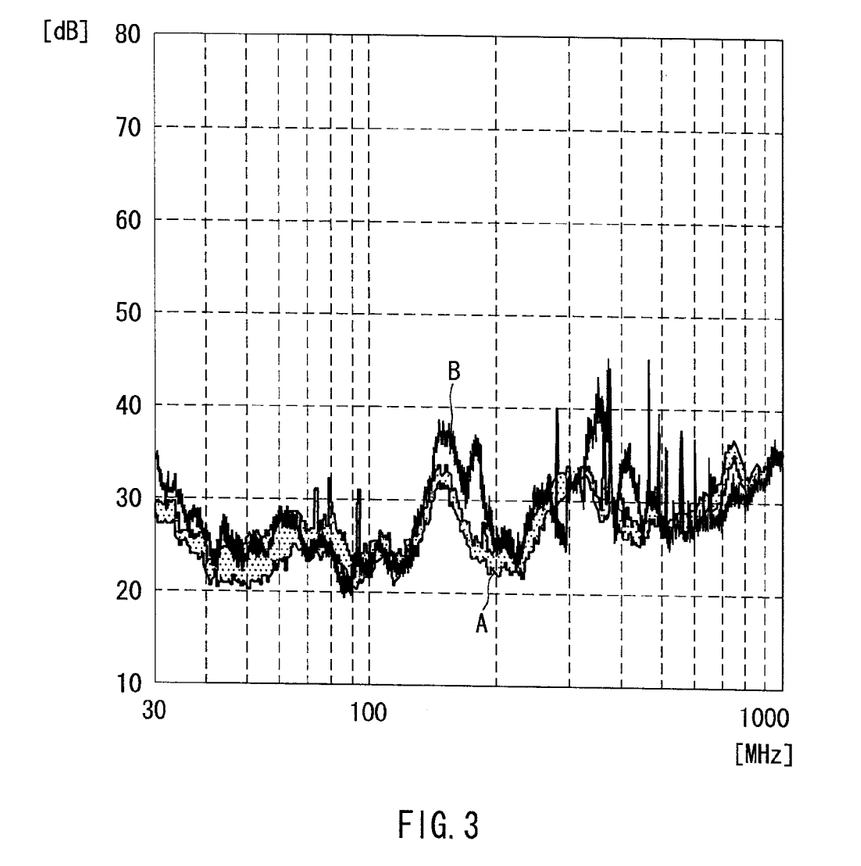
FIG. 3 is a diagram that illustrates the EMI suppression effects produced by the electronic circuit illustrated in the first embodiment.

FIG. 3 shows the EMI radiation level measurement results obtained by examining the effects of magnetic stray field noise suppression in the electronic circuit of the present embodiment. The level of EMI radiation is plotted along the Y-axis in db and the frequency bands are plotted in MHz along the X-axis.

In comparison with the level of EMI radiation emitted from the conventional electronic circuit, which is indicated by "B" in FIG. 3, the level of EMI radiation emitted from the electronic circuit of the present embodiment, which is indicated by "A" in FIG. 3, in other words, the electronic circuit in which magnetic field cancellation effects had been applied to the 24 bypass capacitors, decreased in the vicinity of the 150-MHz frequency band and the 300-500-MHz band, and remained at a level of not more 35 dB in all the frequency bands. Therefore, it was confirmed that electromagnetic noise emissions were suppressed in comparison with the conventional electronic circuit, which had a noise level of about 45 dB in the 30~500-MHz band, that is, in the high frequency band.

It should be noted that the embodiment described above illustrated an example, in which magnetic stray field cancellation effects due to currents flowing through the bypass capacitors 7 was generated in addition to the magnetic stray field cancellation effect generated by currents flowing through the through wire interconnects 4a, 4b, i.e., the first wire interconnect and the second wire interconnect that connect the bump electrodes 2 serving as the connecting electrodes of the circuit substrate 1, i.e. the source of the noise, to the terminal electrodes 8 of the bypass capacitor 7. However, in the electronic circuit of the present embodiment, producing a magnetic stray field cancellation effect with the help of the currents flowing through the bypass capacitors is not essential. An electromagnetic radiation noise suppression effect can be achieved using the magnetic stray field cancellation effects generated by the electric currents flowing through the wire interconnects, which offer longer current paths and are easier to place in close proximity.

As described above, the electronic circuit of the present embodiment is an electronic circuit, in which electromagnetic noise emissions are suppressed by a magnetic stray field cancellation effect produced by making both the placement gap between the bump electrodes, i.e. the connecting electrodes of the integrated circuit, and the placement gap between the terminal electrodes of the bypass capacitors wider than the placement gap between the through wire interconnects, i.e. the wire interconnects that are formed in the circuit substrate and that are used to connect them.

As can be understood by comparing the cross-sectional structure of the conventional electronic circuit illustrated in FIG. 9, which is based on an electromagnetic noise emission suppression approach that utilizes the conventional methods, and FIG. 1, which shows the cross-sectional configuration of the electronic circuit of the present embodiment, the placement gap between the through wire interconnects in the electronic circuit of the present embodiment is smaller, as a result of which the path that connects the connecting electrodes of the integrated circuit to the terminal electrodes of the bypass capacitors is made longer than the rectilinear path that connects the connecting electrodes to the terminal electrodes in the conventional electronic circuit. In other words, the electronic circuit of the present embodiment utilizes more effective electromagnetic noise emission suppression means while offering a solution different from that of the conventional means for suppressing electromagnetic noise emissions from active devices operating at high frequencies, which involves placing bypass capacitors in the closest possible physical proximity to the source of the noise, i.e. the integrated circuit.

It should be noted that while the placement gap "a" between the connecting electrodes of the integrated circuit and the placement gap "b" between the electrode terminals at both ends of the bypass capacitors are shown as having nearly identical dimensions in the electronic circuit of the present embodiment illustrated in FIG. 1, the electronic circuit of the present embodiment is not limited thereto. When the placement gap "a" between the connecting electrodes of the integrated circuit and the placement gap "b" between the electrode terminals at both ends of the bypass capacitors are different, the electronic circuit of the present embodiment produces the above-described remarkable actions and effects by making the placement gap "c" between the wire interconnects smaller than either one of them.

An electronic circuit used in a modification of the present embodiment is explained below with reference to FIG. 4.

Figure 4:
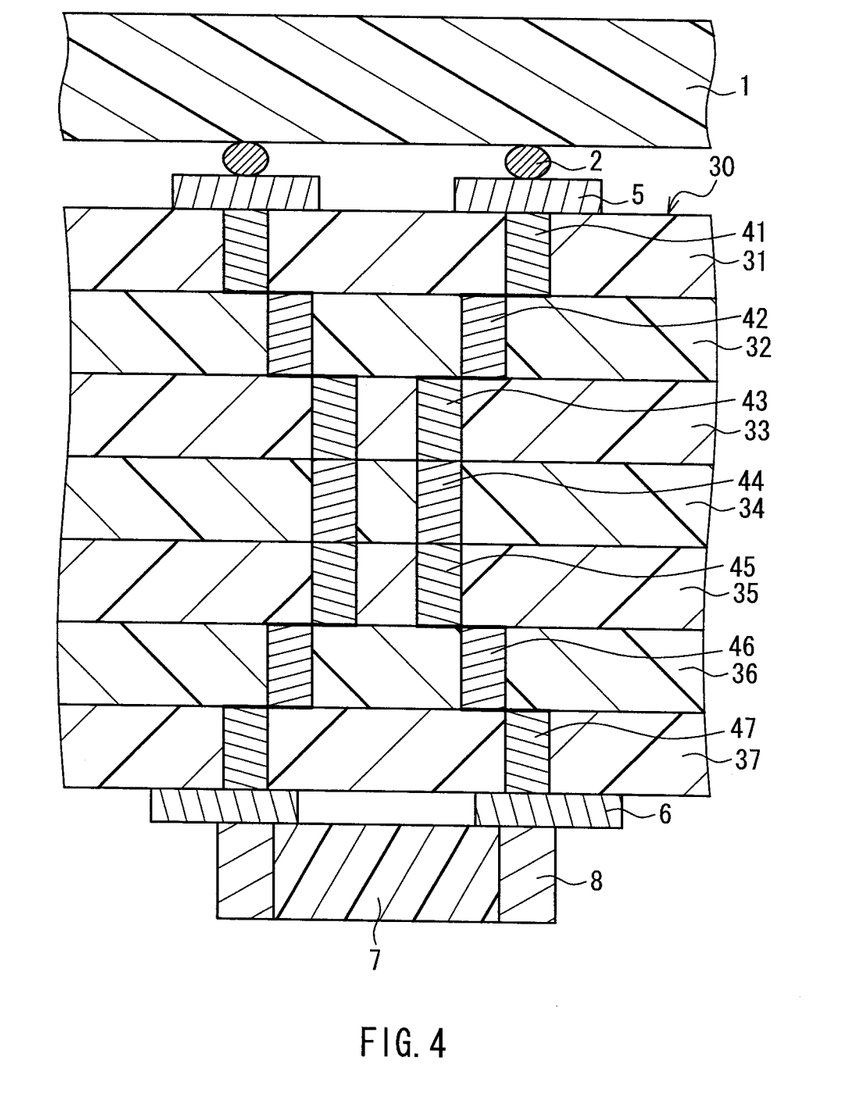
FIG. 4 is an enlarged plan view of the main body illustrating the configuration of the bypass capacitor-bearing portion of an electronic circuit used in a modification of the first embodiment.

FIG. 4 is an enlarged cross-sectional view of the main body illustrating the schematic configuration of the electronic circuit 110 used in a modification of the present embodiment. FIG. 4 corresponds to FIG. 1, which illustrates the cross-sectional configuration of the electronic circuit 100 of the present embodiment.

The modified electronic circuit 110 illustrated in FIG. 4 differs from the electronic circuit 100 of the present embodiment illustrated in FIG. 1 in that the circuit substrate 30 is a multi-layer substrate produced by laminating multiple substrates. For this reason, like parts are designated like reference numerals similar to those used in the electronic circuit 100 illustrated in FIG. 1 and their detailed description is omitted, with the exception of the circuit substrate 30.

Specifically, the circuit substrate 30 is formed by laminating, e.g. the seven substrates 31, 32, 33, 34, 35, 36, and 37. Wiring patterns, not shown, are formed on the respective surfaces of the seven substrates 31-37 and appropriate through wire interconnects are formed in each one of the substrates 31-37. In addition, the through wire interconnects and wiring patterns provided in each one of these substrates are interconnected, thereby forming the overall wiring pattern of the circuit substrate 30.

In the electronic circuit 110 illustrated in FIG. 4, the through wire interconnects 41-47 formed in the respective laminated substrates 31-37 are interconnected and provide a connection between the mounting electrode pads 5 and device-mounting electrodes 6 formed on both exterior surfaces of the circuit substrate 30. Among the laminated substrates 31-37, the substrates 33, 34, and 35, which are disposed in the central portion of the circuit substrate 30, have narrower placement gaps between the through wire interconnects 43, 44, and 45 formed in the substrates 33, 34, and 35. At the same time, in the substrates 31 and 37 disposed on the surface of the circuit substrate 30, the placement gaps between the through wire interconnects 41, 47 formed in the substrates 31, 37 are set to a wider distance. In addition, in the substrates 32 and 36, which are located in between, the placement gaps of the through wire interconnects 42, 46 in the substrates 32, 36 are set to an intermediate width. As a result, as shown in FIG. 4, the through wire interconnects can be formed such that their placement gap is wider in the substrates that are closer to the surfaces of the multi-layer substrate, i.e. the circuit substrate 30, and their placement gap is narrower in the substrates located in the central portion of the circuit substrate 30.

It should be noted that when the gap between the wire interconnects varies as shown in the electronic circuit 110 used in the modified example illustrated in FIG. 4, the placement gap between the wire interconnects in the narrowest portion has to be smaller than either the gap between the connecting electrodes of the integrated circuit or the gap between the terminal electrodes of the bypass capacitors. And, quite naturally, in order to generate a sufficiently strong magnetic stray field cancellation effects using the oppositely oriented electric currents flowing through the adjacent wire interconnects, it is preferable to use a design wherein the length of the narrowest portion is equal to or greater than a certain constant value.

In this manner, in the electronic circuit 110 used in the modified example of the present embodiment, the through wire interconnects serving as the first and second wire interconnects that connect the connecting electrodes 2 of the integrated circuit 1 to the electrode terminals 8 of the bypass capacitors 7, are formed by connecting the through wire interconnects 41-47 such that their placement gap is different in the different substrates 31-37 that make up the multi-layer substrate. When this is done, the through wire interconnects, which have electric currents flowing therethrough in opposite directions, are brought closer together in the central portion of the circuit substrate 30, thereby producing a pronounced magnetic stray field cancellation effect. At the same time, on the surfaces of the circuit substrate 30, the through wire interconnects can be formed to match the electrode pads and device-mounting electrodes provided at the locations corresponding to the placement gaps of the interconnected electrode terminals 8 of the bypass capacitors 7 and connecting electrodes 2 of the integrated circuit 1.

As a result of changing the locations of the through wire interconnects formed in the substrates, as shown in the electronic circuit 110 used in the modified example of the present embodiment, it is no longer necessary to increase the surface area of the mounting electrode pads 5 and device-mounting electrodes 6 disposed on the surface of the circuit substrate in order to connect the electrode terminals of the bypass capacitors and the through wire interconnects, or the connecting electrodes of the integrated circuit and the through wire interconnects formed with a narrow placement gap therebetween, as shown in the electronic circuit 100 of the present embodiment illustrated in FIG. 1. Therefore, high design tolerances can be ensured for the placement locations of the electrodes and wiring patterns on the surface of the circuit substrate, and electronic circuits can be obtained, in which multi-layer substrates permitting high-density mounting are used as the circuit substrate. In addition, this has the advantage that electronic circuits traditionally equipped with multi-layer substrate-type circuit substrates can be used without having to redesign the substrates disposed on the outermost sides of the circuit substrate, and conventional substrates thus can be used "as is."

It should be noted that there are no constraints on the specific configurations of the substrates used when the circuit substrate is a multi-layer substrate. For example, in FIG. 4, the multi-layer substrate, i.e. the circuit substrate 30, was formed using seven substrates 31-37 of roughly the same thickness. However, it goes without saying that the number of the substrates and the thickness of the respective substrates can be appropriately varied.

Embodiment 2

An electronic circuit in which the integrated circuit is connected to the circuit substrate using lead frame terminals is illustrated hereinbelow as a second embodiment.

Figure 5:
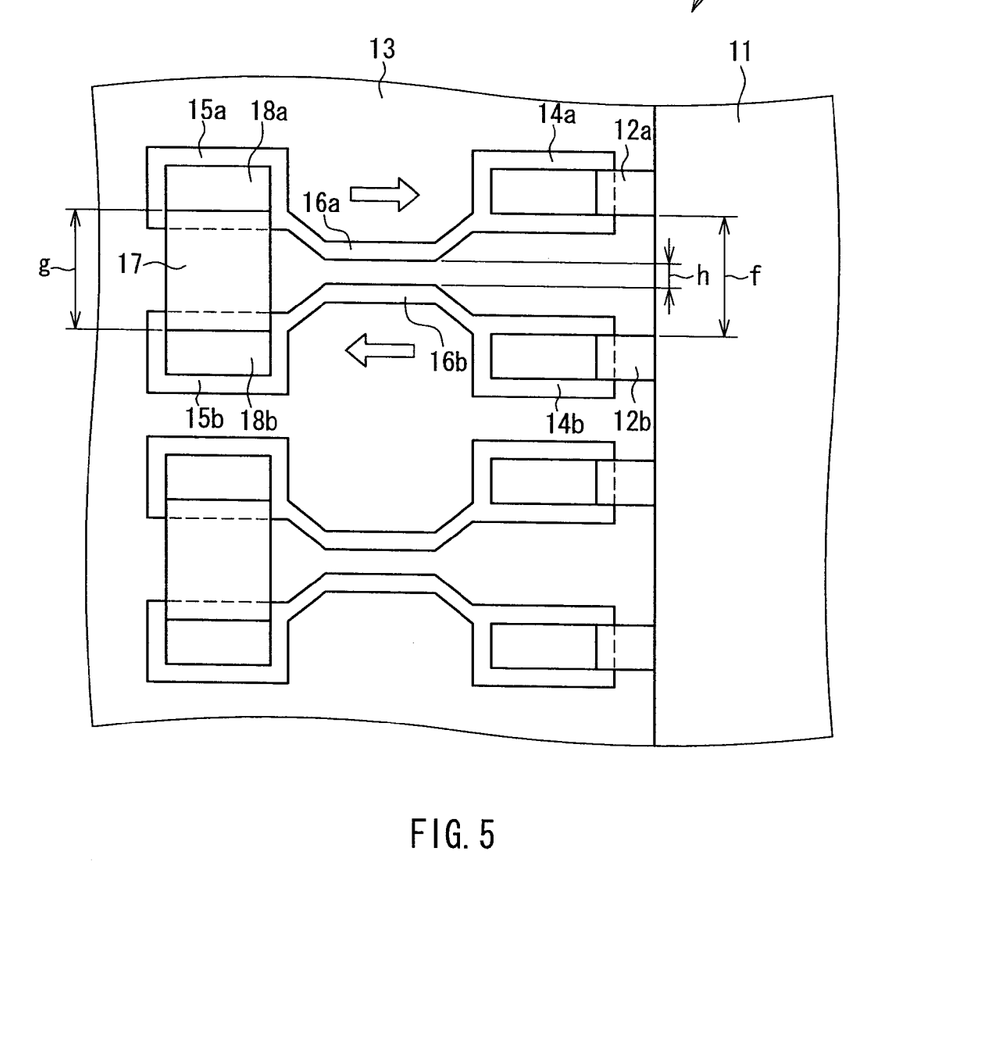
FIG. 5 is an enlarged plan view of the main body illustrating the configuration of the bypass capacitor-bearing portion of the electronic circuit according to the second embodiment.

FIG. 5 is an enlarged plan view of the main body illustrating the planar configuration of the electronic circuit used in the second embodiment.

The electronic circuit 200 used in the second embodiment, as shown in FIG. 5, has an integrated circuit 11 disposed on a circuit substrate 13. The integrated circuit 11 used in the electronic circuit 200 according to the second embodiment is, for example, a packaged LSI chip having lead frame terminals 12 (12a, 12b) extending from one side and used as connecting electrodes.

The distal portions of the lead frame terminals 12 are bent to follow the surface of the circuit substrate 13 and are bonded to mounting electrode pads 14 (14a, 14b) disposed on the circuit substrate 13 using solder etc., not shown.

On the surface of the circuit substrate 13, there are formed device-mounting electrodes 15 (15a, 15b) connected to the mounting electrode pads 14 by wiring patterns 16 (16a, 16b) formed on the surface of the circuit substrate 13. The terminal electrodes 18 (18a, 18b) at both ends are aligned with the device-mounting electrodes 15 (15a, 15b) and a bypass capacitor 17 is mounted and bonded thereto.

In the electronic circuit 200 of the present embodiment, in the circuit substrate 13, the gap "h" between the first wiring pattern 16a, i.e. the first wire interconnect that connects the lead frame terminal 12a serving as one of the connecting electrodes of the integrated circuit 11 to one of the terminal electrodes 18a of the bypass capacitor 17, and the second wiring pattern 16b, i.e. the second wire interconnect that connects the lead frame terminal 12b serving as the other connecting electrode of the integrated circuit 11 to the other terminal electrode 18b of the bypass capacitor 17, is made smaller than either the gap "f" between the lead frame terminal 12a and lead frame terminal 12b or the gap "g" between the one electrode terminal 18a and the other electrode terminal 18b of the bypass capacitor 17.

In this manner, the first wiring pattern 16a and the second wiring pattern 16b, that have electric currents flowing therethrough in opposite directions, as indicated by the white arrows in FIG. 5 are brought closer together. This produces magnetic stray field cancellation effects and enables efficient suppression of electromagnetic noise emissions.

It should be noted that while the electronic circuit 200 according to the second embodiment described with reference to FIG. 5 is illustrated and described as a circuit, in which the integrated circuit 11 and bypass capacitors 17 are mounted on the same surface of the circuit substrate 13, the electronic circuit of the present embodiment is not limited thereto and may be a circuit in which the bypass capacitors 17 are mounted on the back face of the circuit substrate 13.

In addition, while in FIG. 5 the gap "f" between the lead frame terminals 12a, 12b serving as the connecting electrodes of the integrated circuit 11 and the gap "g" between the connecting electrodes 18a, 18b at both ends of the bypass capacitor 17 are illustrated as having roughly the same dimensions, the electronic circuit of the present embodiment is not limited thereto. If the gap "f" between the lead frame terminals 12a, 12b and the gap "g" between the connecting electrodes 18a, 18b at both end of the bypass capacitor 17 are different, a magnetic stray field cancellation effect generated by the electric currents flowing through the connecting electrodes in opposite directions can be obtained by making the gap "h" between the first wiring pattern 16a, i.e. the first wire interconnect, and the second wiring pattern 16b, i.e. the second wire interconnect, smaller than the smallest one of them.

It should be noted that, in the electronic circuit 200 of the present embodiment, the first wiring pattern and second wiring pattern are connected linearly in the horizontal direction of FIG. 5 in order to shorten the path connecting the lead frame terminals of the integrated circuit to the electrode terminals of the bypass capacitor as much as possible. In other words, just like the electronic circuit 100 of the first embodiment illustrated in FIG. 1, the electronic circuit 200 of the present embodiment is an innovative circuit designed to suppress electromagnetic noise emissions using a novel configuration that does not depend on conventional means for suppressing electromagnetic noise emissions.

Embodiment 3

An example of placement of through wire interconnects to provide connections between laminated substrates when the circuit substrate that makes part of the electronic circuit is a multi-layer substrate is described hereinbelow as a third embodiment.

Figure 6:
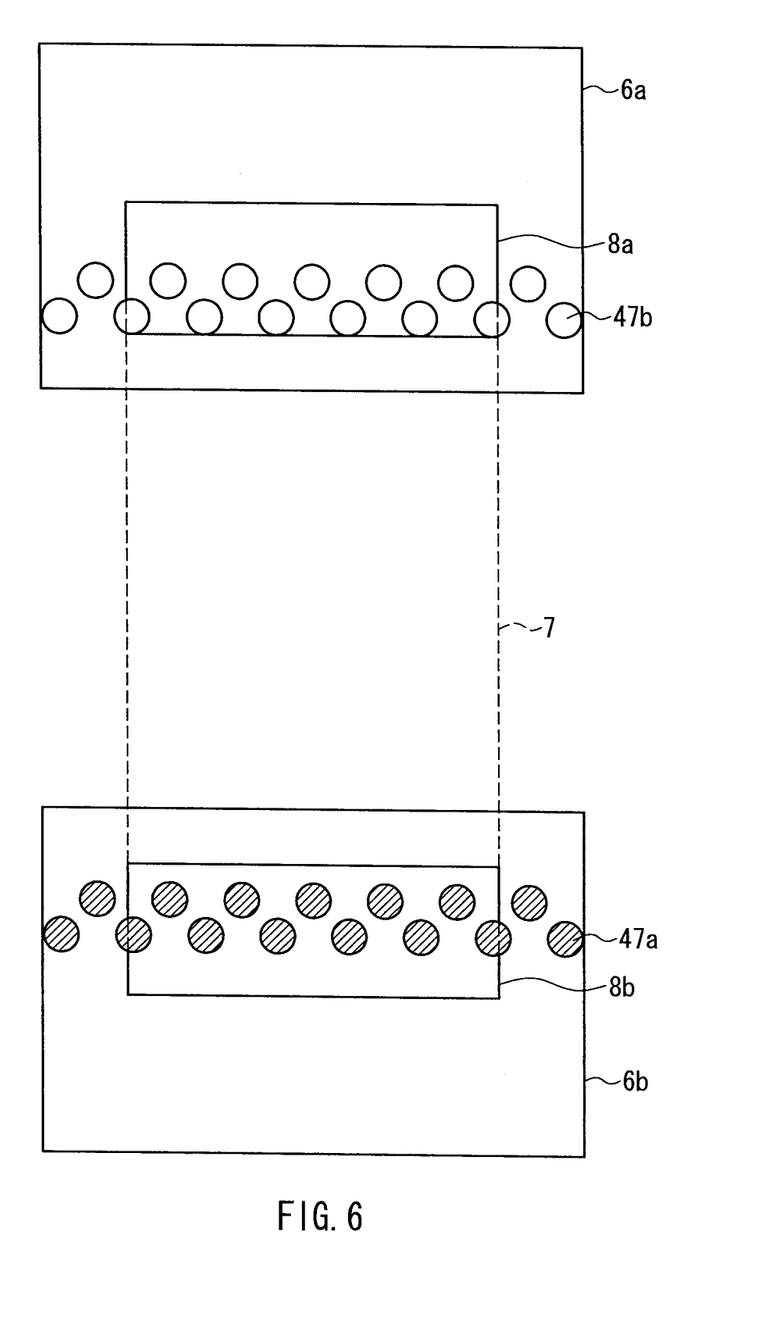
FIG. 6 is an enlarged partial plan view illustrating the locations of the through wire interconnects formed in the seventh substrate of the electronic circuit according to the third embodiment.

FIG. 6 is a partial enlarged plan view that illustrates the locations of placement of through wire interconnects 47 (47a, 47b) formed in the seventh substrate 37 of the electronic circuit 110, in which a multi-layer substrate is used as the circuit substrate 30 illustrated in FIG. 4. The seventh substrate is on the side on which the bypass capacitor 7 is placed.

As shown in FIG. 4, the substrate 37 is the substrate on the surface of the side opposite the first substrate 31, on which the integrated circuit 1 is mounted in the multi-layer substrate 30. The bypass capacitor 7 is placed on its surface. As shown in FIG. 6, on the seventh substrate 37, two terminal electrodes, 8a and 8b, of the bypass capacitor 7 respectively are connected to the device-mounting electrodes 6a, 6b formed on the substrate 37.

Through wire interconnects 47a, 47b, which go through the substrate 37, are connected to the device-mounting electrodes 6a, 6b as well as to a wiring pattern, not shown, formed on the sixth substrate 36, which is one substrate deeper inside the multi-layer substrate 30.

Although for convenience purposes each one of the respective through wire interconnects 41-47 is shown as a single columnar-shaped object in FIG. 4, the diameter of the through wire interconnects 41-47, that go through the substrates 31-37 making up the multi-layer substrate 30, is limited due to the constraints imposed by the method of fabrication, in which the interconnects are formed by injecting metal into via holes formed by etching the substrates 31-37. For this reason, as illustrated by the through wire interconnects 41-47, which connect the integrated circuit 1 to the bypass capacitor 7 and are formed in the substrates 31-37 of the multi-layer substrate 30 that forms part of the electronic circuit of the present embodiment, in order to produce through wire interconnects 41-47 that would provide a trace path with the lowest possible trace resistance, the through wire interconnects 41-47 that make up a trace path serving as a single wire interconnect are formed as a series of multiple via-traces.

As shown in FIG. 6, in the seventh substrate 37 of the present embodiment, through wire interconnects 41a, 47b are formed in each terminal electrode 8a, 8b of the bypass capacitor 7 as fifteen via-traces arranged in two rows. It should be noted that, quite naturally, the number of the through wire interconnects 47 formed in one terminal electrode 8, as well as the number of their rows, is selected appropriately depending on the available substrate space and, in particular, on the size of the electrode terminals of the components connected when connecting circuit components such as bypass capacitors and the like.

Figure 7:
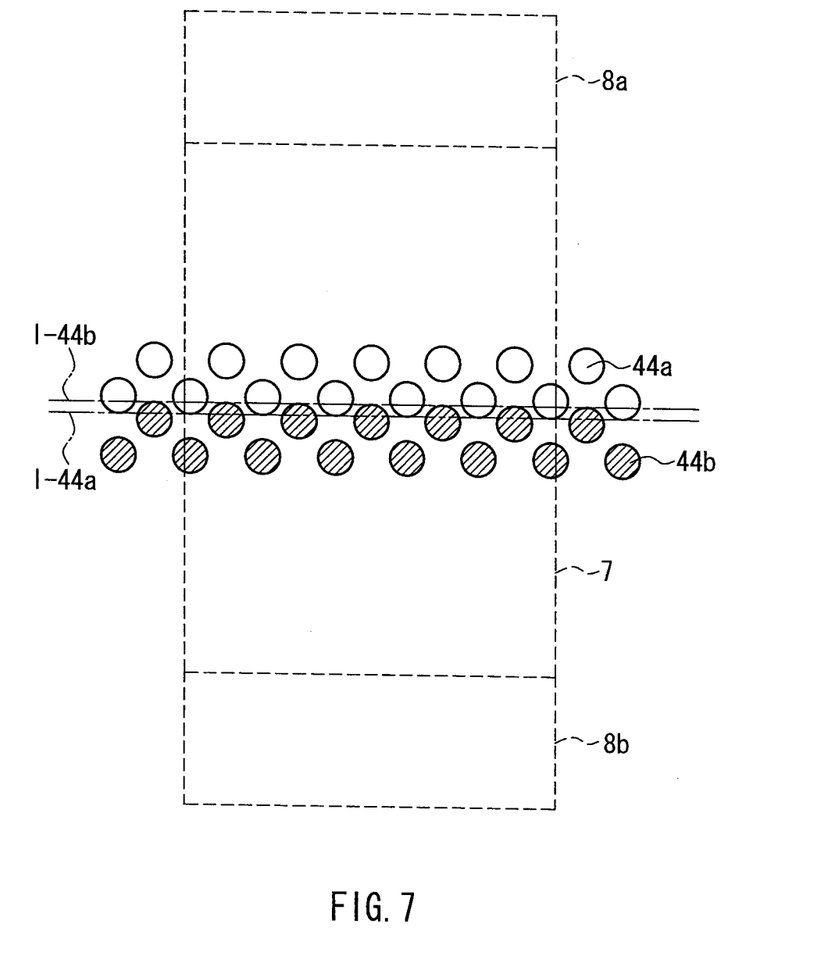
FIG. 7 is an enlarged partial plan view illustrating the locations of the through wire interconnects formed in the fourth substrate of the electronic circuit according to the third embodiment.

FIG. 7 is an enlarged partial plan view illustrating the placement locations of through wire interconnects 44 (44a, 44b) formed in the fourth substrate 34, which is located in the central portion in the stacking direction of the multi-layer substrate 30 of the electronic circuit 110 of the present embodiment.

As shown in FIG. 7, the through wire interconnects 44a, 44b formed in the fourth substrate 34 are placed such that the position 1-44a, which is where the multiple A-side through wire interconnects 44a protrude the most into the B-side occupied by the through wire interconnects 44b, is located deeper into the B-side of the through wire interconnects 44b than position 1-44b, which is where the multiple B-side through wire interconnects 44b protrude the most into the A-side, where the through wire interconnects 44a are located. In other words, the adjacent through wire interconnects are placed in a staggered manner such that multiple through wire interconnects forming the first wire interconnect enter the gaps between the multiple through wire interconnects forming the second wire interconnect. This makes it possible to ensure the respective independence of the multiple through wire interconnects 41a, 44b and, at the same time, reduce the distance between the paths of the electric currents flowing in opposite directions, thereby producing considerable magnetic stray field cancellation effects.

Figure 8:
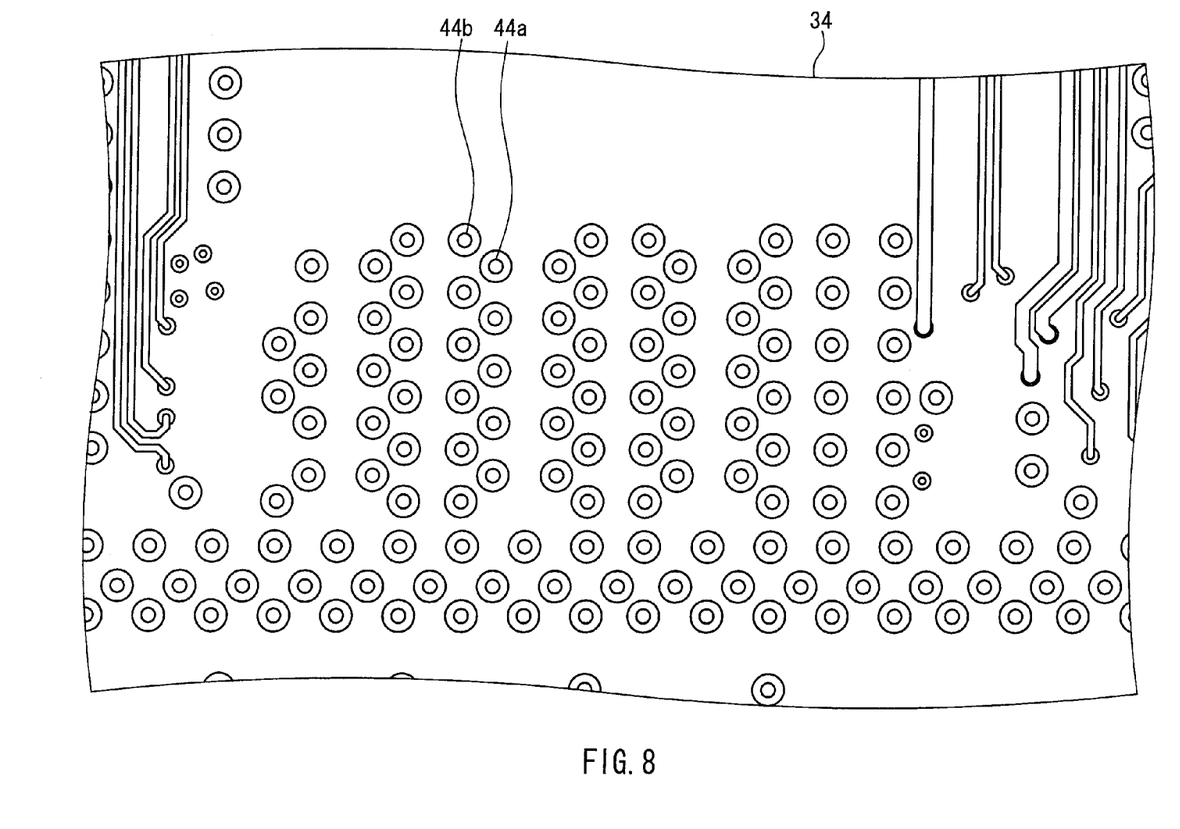
FIG. 8 is an enlarged partial plan view illustrating an exemplary wiring pattern formed on the fourth substrate of the electronic circuit according to the third embodiment.

FIG. 8 shows a wiring pattern formed on a substrate in an actual electronic circuit.

As shown in FIG. 8, the interconnects are placed in close proximity, such that the through wire interconnects 44a and 44b form a mutually staggered configuration in the wiring pattern formed on the fourth substrate 34.

It should be noted that while in FIG. 5 the through wire interconnects 44a and through wire interconnects 44b are formed such that there are five or six of them in a single row, this is merely an example, and the number of the through wire interconnects 44 connected to one of the terminals 8 of the bypass capacitor 7, as well as the number of their rows, are set appropriately to ensure that there are as many of them as possible depending on the available surface area on the substrate 34.

In addition, as shown in FIG. 4, in the electronic circuit 110 illustrated in the present embodiment, the through wire interconnects 43, 44, and 45 are formed with identical gaps therebetween in the three substrates 33, 34, and 35 located in the center in the stacking direction of the multi-layer substrate 30. For this reason, through wire interconnects 43, 45 (not shown) are formed in the third substrate 33 and in the fifth substrate 35 in the same manner as in the fourth substrate 34 illustrated in FIG. 7 and FIG. 8.

As described above with reference to specific configuration examples, in the electronic circuits of the embodiments described above, the wire interconnects connecting the connecting electrodes of the integrated circuit to the electrode terminals of the bypass capacitor are formed such that the placement gap therebetween is made smaller than either the gap between the connecting electrodes of the integrated circuit and the gap between the electrode terminals of the bypass capacitor, thereby producing a magnetic stray field cancellation effect due to the electric currents flowing through the wire interconnects in opposite directions, and enabling suppression of electromagnetic noise emissions.

Since it is an electronic circuit, in which electromagnetic noise emissions are suppressed even if the circuit is equipped with an integrated circuit used as a high-frequency active device, the electronic circuit disclosed herein can be advantageously employed as a basic component of various electronic and information devices.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic circuit, comprising:
an integrated circuit comprising first and second connecting electrodes,
a bypass capacitor comprising first and second electrode terminals, and
a circuit substrate, on which the integrated circuit and the bypass capacitor are mounted, wherein
the first electrode terminal of the bypass capacitor and the first connecting electrode of the integrated circuit are connected through a first wire interconnect formed in the circuit substrate, and the second electrode terminal of the bypass capacitor and the second connecting electrode of the integrated circuit are connected through a second wire interconnect,
a gap between the first wire interconnect and the second wire interconnect is smaller than either a gap between the first and second connecting electrodes or a gap between the first and second electrode terminals,
the integrated circuit is flip-chip mounted on a mounting face of the circuit substrate through bump electrodes as the connecting electrodes, the bypass capacitor is mounted on a back face of the circuit substrate, and the first wire interconnect and the second wire interconnect are through wire interconnects that connect the mounting face of the circuit substrate to the back face of the circuit substrate,
the circuit substrate is a multi-layer substrate obtained by laminating a plurality of substrates, and
the first wire interconnect and the second wire interconnect are formed as multiple through wire interconnects formed in each respective substrate stratum constituting the multi-layer substrate, and the gap between the through wire interconnects formed in a substrate located in a central portion in the thickness direction of the multi-layer substrate is smaller than the gap between the through wire interconnects formed in a substrate disposed on the surface of the multi-layer substrate.

2. The electronic circuit according to claim 1, wherein two of the bypass capacitors are mounted on the back surface of the circuit substrate and form a group, and the two bypass capacitors forming a group are placed at a placement pitch that is narrower than the placement pitch of the bump electrodes of the integrated circuit to which they are respectively connected, and, at the same time, such that the electric currents flowing through the two bypass capacitors that form the group are oriented in mutually opposite directions.

3. The electronic circuit according to claim 1, wherein the integrated circuit is mounted on the circuit substrate using lead frame terminals that serve as the connecting electrodes, and the first wire interconnect and the second wire interconnect are wiring patterns formed on the circuit substrate that connects the lead frame terminals to the electrode terminals of the bypass capacitor.

4. An electronic circuit, comprising:
an integrated circuit comprising first and second connecting electrodes,
a bypass capacitor comprising first and second electrode terminals, and
a circuit substrate, on which the integrated circuit and the bypass capacitor are mounted, wherein
the first electrode terminal of the bypass capacitor and the first connecting electrode of the integrated circuit are connected through a first wire interconnect formed in the circuit substrate, and the second electrode terminal of the bypass capacitor and the second connecting electrode of the integrated circuit are connected through a second wire interconnect,
a gap between the first wire interconnect and the second wire interconnect is smaller than either a gap between the first and second connecting electrodes or the gap between the first and second electrode terminals,
the integrated circuit is flip-chip mounted on a mounting face of the circuit substrate through bump electrodes as the connecting electrodes, the bypass capacitor is mounted on a back face of the circuit substrate, and the first wire interconnect and the second wire interconnect are through wire interconnects that connect the mounting face of the circuit substrate to the back face of the circuit substrate,
the circuit substrate is a multi-layer substrate obtained by laminating a plurality of substrates,
the first wire interconnect and the second wire interconnect are formed as multiple through wire interconnects formed in each respective substrate stratum constituting the multi-layer substrate, and the gap between the through wire interconnects formed in a substrate located in a central portion in the thickness direction of the multi-layer substrate is smaller than the gap between the through wire interconnects formed in a substrate disposed on the surface of the multi-layer substrate, and
respective pluralities of through wire interconnects form the first wire interconnect and the second wire interconnect.

5. An electronic circuit, comprising:
an integrated circuit comprising first and second connecting electrodes,
a bypass capacitor comprising first and second electrode terminals, and
a circuit substrate, on which the integrated circuit and the bypass capacitor are mounted, wherein
the first electrode terminal of the bypass capacitor and the first connecting electrode of the integrated circuit are connected through a first wire interconnect formed in the circuit substrate, and the second electrode terminal of the bypass capacitor and the second connecting electrode of the integrated circuit are connected through a second wire interconnect,
a gap between the first wire interconnect and the second wire interconnect is smaller than either a gap between the first and second connecting electrodes or a gap between the first and second electrode terminals,
the integrated circuit is flip-chip mounted on a mounting face of the circuit substrate through bump electrodes as the connecting electrodes, the bypass capacitor is mounted on a back face of the circuit substrate, and the first wire interconnect and the second wire interconnect are through wire interconnects that connect the mounting face of the circuit substrate to the back face of the circuit substrate,
the circuit substrate is a multi-layer substrate obtained by laminating a plurality of substrates,
the first wire interconnect and the second wire interconnect are formed as multiple through wire interconnects formed in each respective substrate stratum constituting the multi-layer substrate, and the gap between the through wire interconnects formed in a substrate located in a central portion in the thickness direction of the multi-layer substrate is smaller than the gap between the through wire interconnects formed in a substrate disposed on the surface of the multi-layer substrate,
respective pluralities of through wire interconnects form the first wire interconnect and the second wire interconnect, and
the plurality of through wire interconnects forming the first wire interconnect are placed in a staggered manner such that they enter the gaps between the plurality of through wire interconnects forming the second wire interconnect.

* * * * *